United States Patent [19]
Yamamoto

[11] Patent Number: 5,960,960
[45] Date of Patent: Oct. 5, 1999

[54] WAFER CARRIER

[75] Inventor: Nobuo Yamamoto, Kumamoto, Japan

[73] Assignee: NEC Corporation, Tokyo, Japan

[21] Appl. No.: 08/951,054

[22] Filed: Oct. 15, 1997

[30] Foreign Application Priority Data

Oct. 15, 1996 [JP] Japan .................................. 8-272149

[51] Int. Cl.⁶ .................................................. B65D 85/90
[52] U.S. Cl. ........................... 206/711; 53/473; 206/454; 206/832; 211/41.18
[58] Field of Search ................................... 206/454, 710, 206/711, 712, 832, 833; 211/41.18; 118/500; 53/473, 475

[56] References Cited

U.S. PATENT DOCUMENTS

| | | | |
|---|---|---|---|
| 4,043,451 | 8/1977 | Johnson | 206/454 |
| 4,176,751 | 12/1979 | Gillissie | 206/832 |
| 4,858,764 | 8/1989 | Domokos | 206/454 |
| 4,872,554 | 10/1989 | Quernemoen | 206/454 |
| 4,993,559 | 2/1991 | Cota | 211/41.18 |
| 5,025,924 | 6/1991 | Watnabe | 206/711 |
| 5,255,797 | 10/1993 | Kos | 206/711 |
| 5,370,142 | 12/1994 | Nishi et al. | 206/832 |
| 5,452,795 | 9/1995 | Gallagher et al. | 206/454 |
| 5,586,658 | 12/1996 | Nyseth . | |

FOREIGN PATENT DOCUMENTS 8-53187  2/1996  Japan .

*Primary Examiner*—Jim Foster

[57] ABSTRACT

A wafer carrier includes a housing having an interior chamber which has a plurality of rows of grooves having a predetermined spacing formed thereon such that a plurality of wafers can be stored into the grooves of each row, respectively. The wafer carrier further includes a plurality of rows of movable elastic pieces provided around the interior chamber. The movable elastic pieces of each row corresponds to the grooves of each row formed on the interior chamber, respectively, and each movable elastic piece of each row is movable along a direction of the row between a first position of a corresponding groove and a second position between the corresponding groove and an adjacent groove.

10 Claims, 4 Drawing Sheets

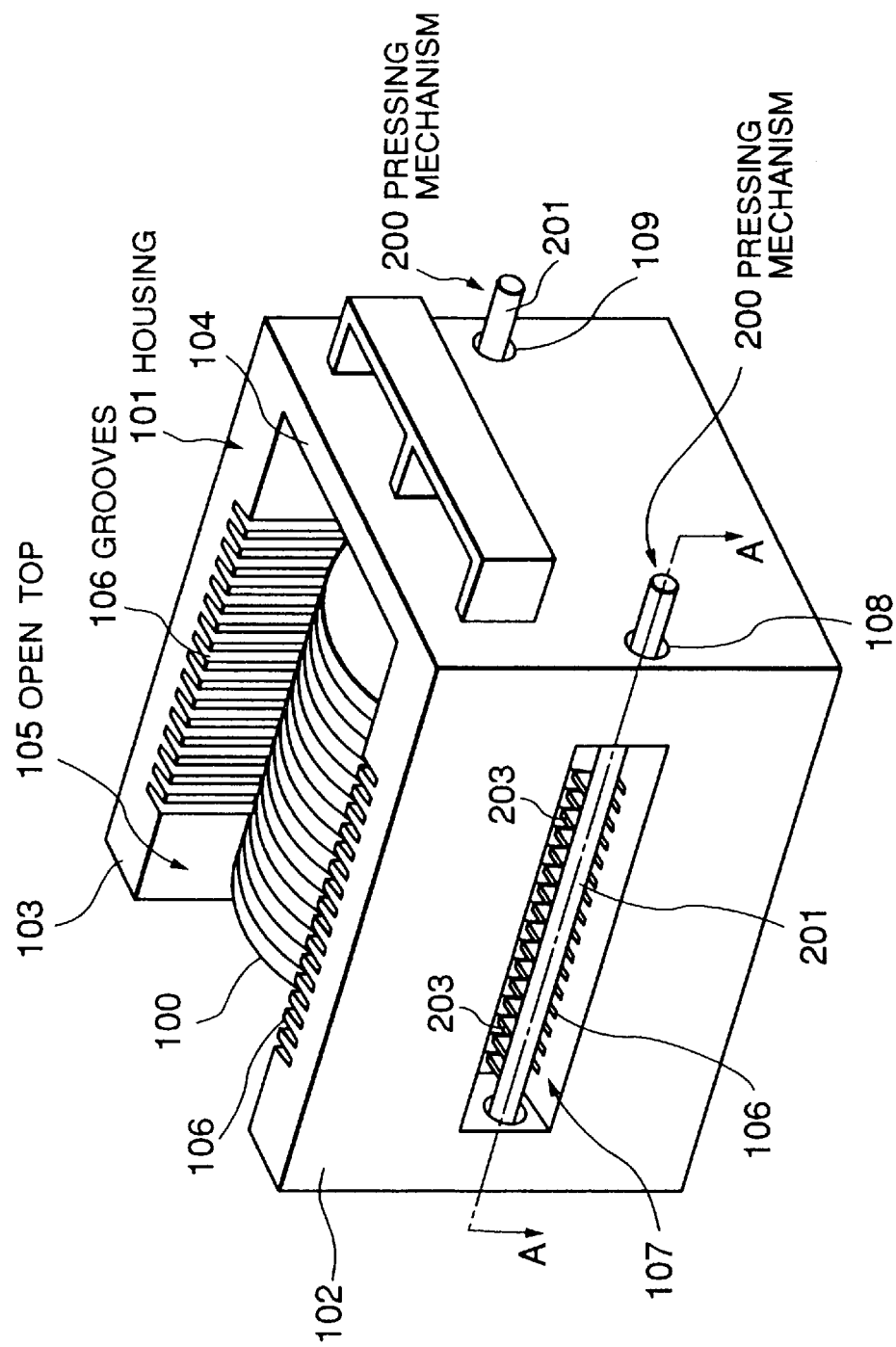

WAFER CARRIER

BACKGROUND OF THE INVENTION

1. Field of the Invention

The present invention relates to a wafer carrier which is capable of carrying a plurality of wafers for semiconductor wafer processing.

2. Description of the Related Art

When a plurality of wafer are carried from one processing unit to another or they are in storage for semiconductor wafer processing, a wafer carrier is commonly used to support and maintain them. In general, a wafer carrier is composed of a housing having an interior chamber formed to store the wafers therein and an open top to provide access into the interior chamber. The side walls of the interior chamber have a plurality of grooves having a predetermined spacing where the wafers are stored, respectively. The width of a groove is usually set to two or three times the thickness of a wafer to allow easy loading and unloading. Therefore, in some cases, it is necessary to safely store the wafers in the grooves to prevent the possibility of wafer damage due to vibration and contamination due to airflow caused by the vibration when carried.

A wafer container which can safely store the wafers has been disclosed in U.S. Pat. No. 5,586,658. The wafer container is composed of a wafer carrier, a top cover and a bottom cover. The respective wafers stored in the grooves of the wafer carrier are secured with the top and bottom covers each having a plurality of rows of cushioning tabs formed on the inside wall thereof.

However, the above wafer container is not directed to wafer processing but wafer shipment. Therefore, the wafer container needs the top and bottom covers in addition to the wafer carrier. In other words, the conventional wafer carrier of the wafer container cannot secure the wafers to prevent damage and contamination. Further, since the wafers are covered with the top and bottom covers, it is difficult to load and unload the wafer carrier with the wafers. Therefore, the wafer container is not suitable for automation of wafer processing.

SUMMARY OF THE INVENTION

An object of the present invention is to provide a wafer carrier which can safely store a plurality of wafers while allowing easy operation of loading and unloading.

Another object of the present invention is to provide a wafer carrier which is suitable for automation of wafer processing.

According to the present invention, a wafer carrier is provided with movable elastic pieces which corresponds to stored wafers, respectively, and are capable of moving in a direction of the row thereof as necessary.

In other words, the wafer carrier includes a housing having an interior chamber which has a plurality of rows of grooves having a predetermined spacing formed thereon such that the grooves of each row are substantially in planes orthogonal to a direction of the rows, respectively. The wafer carrier further includes a plurality of rows of movable elastic pieces provided around the interior chamber such that each movable elastic piece is placed at a predetermined position. The movable elastic pieces of each row corresponds to the grooves of each row formed on the interior chamber, respectively, and each movable elastic piece of each row is movable along a direction of the row between a first position of a corresponding groove and a second position between the corresponding groove and an adjacent groove.

According to another aspect of the present invention, a wafer carrier includes a box-shaped housing having an interior chamber which has a pair of side walls providing an opening for wafer loading and unloading, wherein each of the side walls has a plurality of grooves formed on an inside surface thereof to receive wafers, Further, the wafer carrier includes a plurality of pressing mechanisms each having a row of movable elastic pieces movable in a direction of the row, wherein the pressing mechanisms are placed around the interior chamber and the movable elastic pieces of each pressing mechanism correspond to the grooves formed on the interior chamber, respectively. Each pressing mechanism moves each movable elastic piece to press an end portion of a wafer received in a corresponding groove against one side wall of the corresponding groove.

Each of the pressing mechanisms may be comprised of a movable rod having the movable elastic pieces directed to the interior chamber wherein the movable rod is movable in the direction of the row and an energizing member for applying a force to the movable rod in a predetermined direction.

BRIEF DESCRIPTION OF THE DRAWINGS

FIG. 1 is a perspective view showing a wafer carrier according to a first embodiment of the present invention;

DETAILED DESCRIPTION OF THE PREFERRED EMBODIMENTS

Figure 2A:
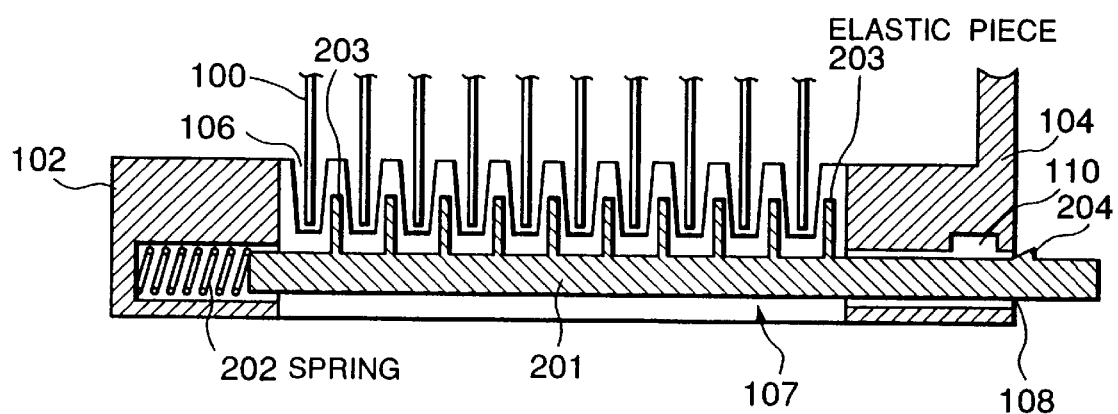
FIG. 2A is a partial cross sectional plan view taken on line A—A of FIG. 1 when unlocked.

Referring to FIG. 1, there is shown a wafer carrier which is capable of storing a plurality of wafers 100. Housing 101 of the wafer carrier is composed of side walls 102 and 103, end wall 104 and open top 105 which are combined to form an interior chamber for storing the wafers 100. The wafers are stored into or removed from the interior chamber through the open top 105.

The respective side walls 102 and 103 have a plurality of grooves 106 formed on the inside surfaces thereof. The vertical length of the grooves 106 is set shorter than a height of the side walls 102 and 103 so that the wafers are stopped in the middle of the interior chamber. Each pair of grooves of the side walls 102 and 103 stores a single wafer. Further, the respective side walls 102 and 103 have openings 107 formed in the middle thereof. Preferably, the respective openings 107 are formed in the groove areas of the side walls 102 and 103. The end wall 104 has openings 108 and 109 at both ends thereof. The wafer carrier is equipped with pressing mechanisms 200 which are provided in the openings 107 of the side walls 102 and 103, respectively, as will be described hereinafter.

Figure 2B:
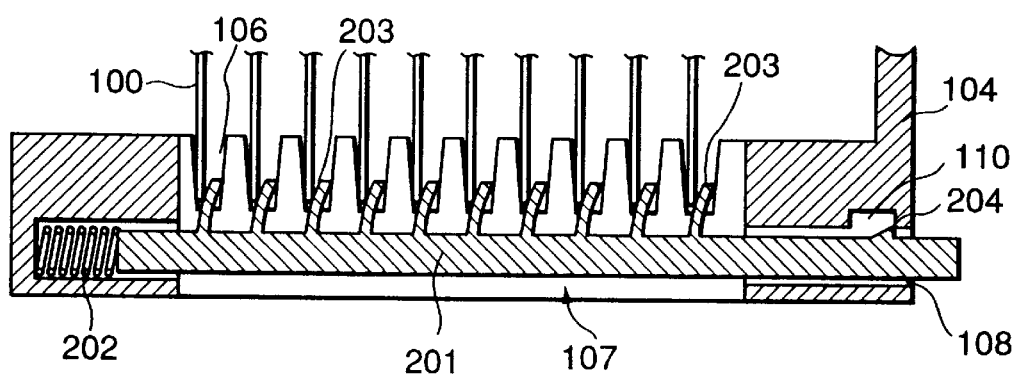
FIG. 2B is a partial cross sectional plan view taken on line A—A of FIG. 1 when locked.

As shown in FIGS. 2A and 2B, the pressing mechanism 200 is composed of a movable rod 201 which is placed in the opening 107 and longitudinally movable through the opening 108 of the end wall 104. Further, the side wall 102 has a spring 202 embedded at the end opposite to the opening 108. When the movable rod 201 is pushed toward the side wall 102, it is energized by the spring 202 in the direction that the movable rod 201 protrudes from the opening 108.

The movable rod 201 is provided with a plurality of elastic pieces 203 corresponding to the grooves 203, respectively. The elastic pieces 203 are preferably made of material with low coefficient of friction and high mechanical strength, such as vinyl hexafluoride. It is more preferable that the movable rod 201 and the elastic pieces 203 are molded in one piece using the material such as vinyl hexafluoride.

The movable rod 201 is further provided with a projection 204. In this embodiment, the diameter of the opening 108 is set greater than that of the movable rod 201 so that the projection 204 can pass through the opening 108. When the movable rod 201 is pushed against the tension of the spring 202, the projection 204 is engaged with a stopper 110 formed in the side wall 102 to stop the movable rod 201 protruding as shown in FIG. 2B.

Since two pressing mechanisms 200 are provided in the side walls 102 and 103, respectively, each wafer is secured at two points when a pair of elastic pieces pushes the wafer against the corresponding pair of grooves. Preferably, each wafer is secured at two end portions thereof on the line passing through the center of the wafer. In the case of a large-diameter wafer, three or four end portions may be used to secure the wafer. In any case, they are preferably symmetric with respect to the center line of the wafer passing through the center point thereof.

Further, a load applied to the wafer by the pressing mechanism 200 is preferably less than several hundreds grams per securing portion.

Hereinafter, how the wafers 100 are secured will be described. When loading, the projection 204 of the movable rod 201 is disengaged with the stopper 204. This causes the movable rod 201 to protrude from the opening 108 and thereby the elastic pieces 203 are positioned between grooves 106 as shown in FIG. 2A. In this unlocked state, the wafers 100 are received through the open top 105 and stored into the grooves 106, respectively.

Subsequently, as shown in FIG. 2B, the movable rod 201 is pushed against the tension of the spring 202 to engage the projection 204 with the stopper 110 The respective elastic pieces 203 are shifted to positions of the grooves 106 to come in contact with the circumference of the wafers. In this looked state, each elastic piece is elastically bent with pushing the corresponding wafer against one wall of the groove with an appropriate load. Accordingly, the respective wafers 100 are secured to the grooves 106 of the wafer carrier and thereby vibration can be effectively prevented when carrying. When unloading, the projection 204 of the movable rod 201 is disengaged with the stopper 204 to position the elastic pieces 203 between grooves 106 as shown in FIG. 2A and then the wafers 100 are removed from the grooves 106 through the open top 105.

Figure 3:
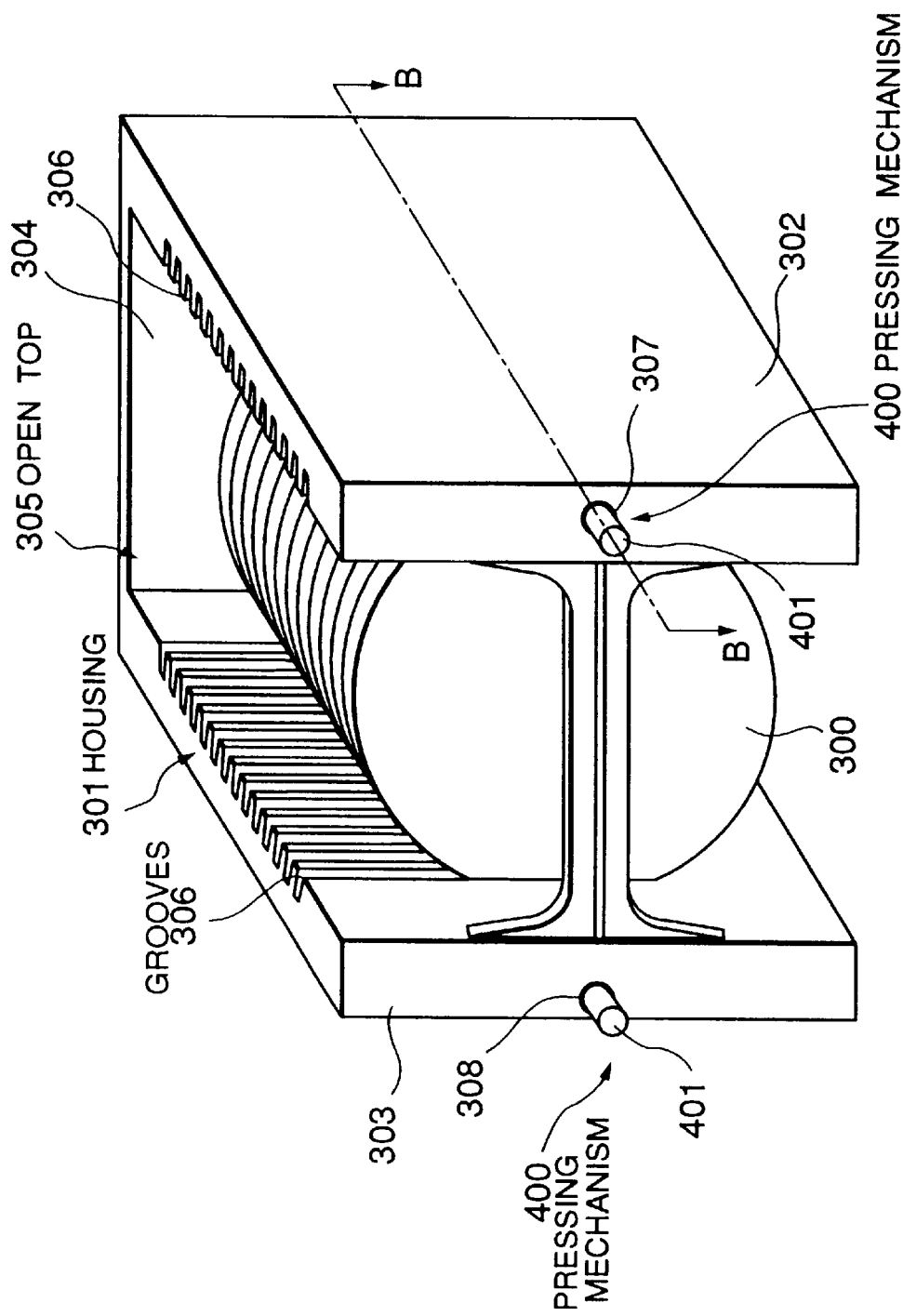
FIG. 3 is a perspective view showing a wafer carrier according to a second embodiment of the present invention.

Referring to FIG. 3, there is shown a wafer carrier storing a plurality of wafers 300 according to a second embodiment of the present invention. Housing 301 of the wafer carrier is composed of side walls 302 and 303, end wall 304 and open top 305 which are combined to form an interior chamber for storing the wafers 300. The wafers are stored into or removed from the interior chamber through the open top 305.

The respective side walls 302 and 303 have a plurality of grooves 306 formed on the inside surfaces thereof. The vertical length of the grooves 306 is set shorter than a height of the side walls 302 and 303 so that the wafers are stopped in the middle of the interior chamber. Each pair of grooves of the side walls 302 and 303 stores a single wafer. Further, the respective side walls 302 and 303 have openings 307 and 308 formed in the middle thereof. The wafer carrier is equipped with pressing mechanisms 400 which are provided and operable through openings 307 and 308 formed in the side walls 302 and 303, respectively, as will be described hereinafter.

Figure 4A:
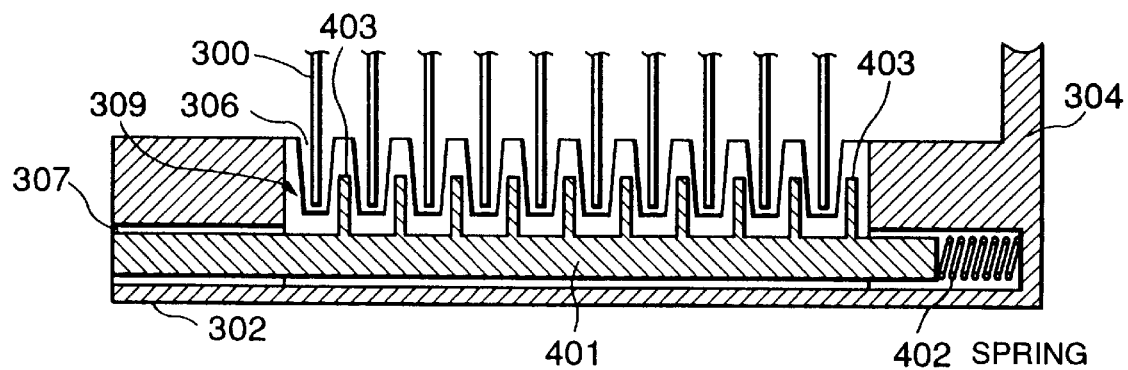
FIG. 4A is a partial cross sectional plan view taken on line B—B of FIG. 3 when unlocked.
Figure 4B:
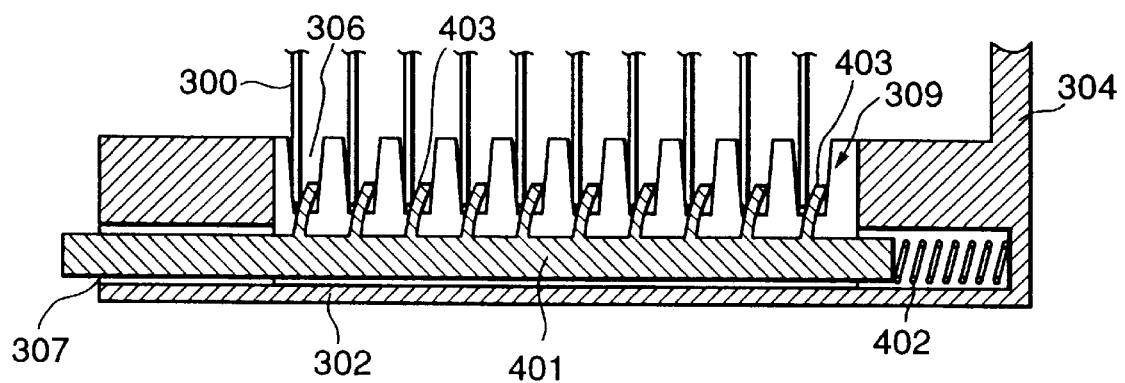
FIG. 4B is a partial cross sectional plan view taken on line B—B of FIG. 3 when locked.

As shown in FIGS. 4A and 4B, the pressing mechanism 400 is composed of a movable rod 401 which is longitudinally movable in the side wall 302 (and 303). Further, the side wall 302 has a spring 402 embedded at the side of the end wall 304. When the movable rod 401 is pushed toward the end wall 304, it is energized by the spring 402 in the direction that the movable rod 401 protrudes from the opening 307.

The movable rod 401 is provided with a plurality of elastic pieces 403 corresponding to the grooves 306, respectively. The elastic pieces 403 are preferably made of material with low coefficient of friction and high mechanical strength as in the first embodiment.

Since two pressing mechanisms 400 are provided in the side walls 302 and 303, respectively, each wafer is secured at two points when a pair of elastic pieces pushes the wafer against the corresponding pair of grooves. Preferably, each wafer is secured at two end portions thereof on the line passing through the center of the wafer. In the case of a large-diameter wafer, three or four end portions may be used to secure the wafer. Further, a load applied to the wafer by the pressing mechanism 400 is preferably less than several hundreds grams per securing portion.

Hereinafter, how the wafers 300 are secured will be described. When loading, the movable rod 401 is pushed against the tension of the spring 402 and thereby the elastic pieces 403 are positioned between grooves 306 as shown in FIG. 4A. In this unlocked state, the wafers 300 are received through the open top 305 and stored into the grooves 306, respectively.

Subsequently, as shown in FIG. 4B, when the movable rod 401 is released, the respective elastic pieces 403 are shifted to positions of the grooves 306 to come in contact with the circumference of the wafers. In this locked state, each elastic piece is elastically bent with pushing the corresponding wafer against One wall of the groove with an appropriate load. Accordingly, the respective wafers 300 are secured to the grooves 306 of the wafer carrier and thereby vibration can be effectively prevented when carrying. When unloading, the movable rod 401 is pushed to position the elastic pieces 403 between grooves 306 as shown in FIG. 4A and then the wafers 300 are removed from the grooves 306 through the open top 305.

In the second embodiment as shown in FIG. 3, the wafers are secured by pushing and then releasing the movable rod 401. Therefore, it is suitable for automation of wafer processing.

In the above embodiments, each wafer may be secured at one or more pair of end portions thereof on the line passing through the center of the wafer. Especially, in the case of a large-diameter wafer, three or four end portions may be used to secure the wafer.

What is claimed is:

1. A wafer carrier comprising:
   a box-shaped housing having an interior chamber which has a pair of side walls providing an opening for wafer loading and unloading, each of the side walls having a plurality of grooves formed on an inside surface thereof to receive wafers; and a plurality of pressing mechanisms each having a row of elastic pieces movable in a direction of the row, the pressing mechanisms being placed around the interior chamber, and the movable elastic pieces of each pressing mechanism corresponding to the grooves formed on the interior chamber, respectively, wherein each pressing mechanism moves each elastic piece to press an end portion of a wafer received in a corresponding groove against one side wall of the corresponding groove, wherein each of the pressing mechanisms comprises:
   a rod having the elastic pieces extending inwardly, the rod being movable in the direction of the row, the rod protruding from the box-shaped housing; and
   a spring member for applying a force to the rod in a predetermined direction.

2. The wafer carrier according to claim 1, further comprising a stopper for stopping the rod moving in the predetermined direction when the rod is pushed against the force of the spring member.

3. The wafer carrier according to claim 2, wherein each elastic piece of the rod presses an end portion of the wafer received in the corresponding groove against one side wall of the corresponding groove in a state where the rod is stopped moving by the stopper, and goes away from the end portion of the wafer when the stopper is released.

4. The wafer carrier according to claim 1, wherein each elastic piece of the rod presses an end portion of the wafer received in the corresponding groove against one side wall of the corresponding groove in a state when the rod is not pushed, and goes away from the end portion of the wafer when the rod is pushed.

5. A wafer carrier comprising:
   a housing having at least two side walls opposite to each other to provide an opening for wafer loading and unloading, each of the side walls having a plurality of grooves spaced on an inside surface thereof to receive a wafer, further each of the sidewalls having a longitudinally extending opening; and
   a rod being disposed in the longitudinally extending opening of each of the side walls for longitudinal movement therein, the rod having a plurality of elastic pieces provided for the grooves, respectively, wherein a wafer received in each groove is fixed and released by the corresponding elastic piece depending on movement of the rod.

6. The wafer carrier according to claim 5, further comprising a spring member for applying a force to the rod in a predetermined direction along the rod.

7. The wafer carrier according to claim 6, wherein the spring member holds the rod in a direction such that a wafer received in each groove is fixed.

8. The wafer carrier according to claim 6, wherein the spring member moves the rod in a direction such that a wafer received in each groove is released.

9. The wafer carrier according to claim 8, wherein the rod 18 includes a protrusion for stopping the rod moving in the direction when the wafer received in each groove is fixed.

10. In a wafer carrier, comprising:
   a box-shaped housing having an interior chamber which has a pair of side walls providing an opening for wafer loading and unloading, each of the side walls having a plurality of grooves formed on an inside surface thereof to receive wafers; and
   a plurality of pressing mechanisms each having a row of elastic pieces movable in a direction of the row, the pressing mechanisms being placed around the interior chamber, and the elastic pieces of each pressing mechanism corresponding to the grooves formed on the interior chamber, respectively, wherein each pressing mechanism moves each elastic piece to press an end portion of a wafer received in a corresponding groove against one side wall of the corresponding groove, wherein each of the pressing mechanisms includes a rod having the elastic pieces extending inwardly, the rod being movable in the direction of the row, the rod protruding from the box-shaped housing; and a spring member for applying a force to the rod in a predetermined direction;
   a method for storing a plurality of wafers in the wafer carrier, comprising the steps of:
      moving the rod in a first direction such that a wafer received in each groove is released;
      storing the wafers into the interior chamber along the grooves; and
      moving the rod in a second direction such that a wafer received in each groove is fixed.

* * * * *